(12) United States Patent
Tomoda et al.

(10) Patent No.: US 10,371,867 B2
(45) Date of Patent: Aug. 6, 2019

(54) OPTICAL COMPONENT AND METHOD OF MANUFACTURING THE SAME

(71) Applicant: NIKON-ESSILOR CO., LTD., Tokyo (JP)

(72) Inventors: Masaoki Tomoda, Sagamihara (JP); Satoru Ito, Nasukarasuyama (JP); Kei Ishimura, Toyohashi (JP); Hirotatsu Okumura, Toyokawa (JP)

(73) Assignee: NIKON-ESSILOR CO., LTD., Tokyo (JP)

( * ) Notice: Subject to any disclaimer, the term of this patent is extended or adjusted under 35 U.S.C. 154(b) by 620 days.

(21) Appl. No.: 13/851,679

(22) Filed: Mar. 27, 2013

(65) Prior Publication Data
US 2013/0222913 A1    Aug. 29, 2013

Related U.S. Application Data

(63) Continuation of application No. PCT/JP2011/070856, filed on Sep. 13, 2011.

(30) Foreign Application Priority Data

Sep. 29, 2010 (JP) .................. 2010-218711
Dec. 24, 2010 (JP) .................. 2010-288319

(51) Int. Cl.
*G02B 1/18* (2015.01)
*G02B 23/16* (2006.01)
(Continued)

(52) U.S. Cl.
CPC .................. *G02B 1/11* (2013.01); *B05D 5/06* (2013.01); *C23C 14/221* (2013.01); *C23C 14/24* (2013.01);
(Continued)

(58) Field of Classification Search
CPC .......... G02B 1/11; G02B 1/113; G02B 1/105; G02C 7/02; B05D 5/06; C23C 14/24; C23C 14/221
(Continued)

(56) References Cited

U.S. PATENT DOCUMENTS 4,921,760 A    5/1990  Tani et al.
6,250,758 B1   6/2001  Yoshihara et al.
(Continued)

FOREIGN PATENT DOCUMENTS

CN    2478138 Y    2/2002
CN    1991441 A    7/2007
(Continued)

OTHER PUBLICATIONS

"Notice of Reasons for Rejection", issued in corresponding Japanese Patent Application No. 2013-026090, dated Jan. 21, 2014, 7 pages.
(Continued)

*Primary Examiner* — Mustak Choudhury
(74) *Attorney, Agent, or Firm* — Finnegan, Henderson, Farabow, Garrett & Dunner, LLP

(57) ABSTRACT

An optical component includes: a plastic base which has a convex surface and a concave surface; and a multilayer film which is disposed on at least the convex surface of the plastic base. The multilayer film has an average reflectivity of 2% to 10% over a wavelength range of 400 nm to 500 nm.

17 Claims, 8 Drawing Sheets

(51) Int. Cl.
  *G02B 1/11*   (2015.01)
  *G02B 1/113*  (2015.01)
  *B05D 5/06*   (2006.01)
  *C23C 14/22*  (2006.01)
  *C23C 14/24*  (2006.01)
  *G02B 1/10*   (2015.01)
  *G02C 7/10*   (2006.01)
  *G02B 1/14*   (2015.01)

(52) U.S. Cl.
  CPC .............. *G02B 1/105* (2013.01); *G02B 1/113* (2013.01); *G02B 1/18* (2015.01); *G02C 7/104* (2013.01); *G02C 7/105* (2013.01); *G02B 1/14* (2015.01)

(58) Field of Classification Search
  USPC ................... 359/513, 601, 229, 488.01, 493; 385/129–131, 141, 36, 33; 362/97.1, 362/97.2; 349/56–58, 61; 264/1.27, 264/1.34, 1.7, 494; 427/162, 164, 525; 351/159.57, 159.65
  See application file for complete search history.

(56) References Cited

U.S. PATENT DOCUMENTS

| | | | |
|---|---|---|---|
| 6,898,024 B2 | 5/2005 | Takeuchi | |
| 7,520,608 B2* | 4/2009 | Ishak | G02C 7/104 351/159.65 |
| 7,715,110 B2 | 5/2010 | Iijima | |
| 2002/0142151 A1 | 10/2002 | Ochiai et al. | |
| 2003/0117718 A1 | 6/2003 | Takeuchi | |
| 2006/0092374 A1 | 5/2006 | Ishak | |
| 2006/0177638 A1* | 8/2006 | Shibuya et al. | 428/212 |
| 2008/0043200 A1 | 2/2008 | Ishak | |
| 2008/0213473 A1* | 9/2008 | Roisin | G02B 1/115 427/162 |
| 2008/0284976 A1 | 11/2008 | Kato et al. | |
| 2009/0097131 A1 | 4/2009 | Iijima | |
| 2009/0257022 A1* | 10/2009 | Abe | G02B 1/105 351/159.57 |

FOREIGN PATENT DOCUMENTS

| | | |
|---|---|---|
| CN | 101595421 A | 12/2009 |
| EP | 0112418 A1 | 7/1984 |
| EP | 0 928 977 A1 | 7/1999 |
| EP | 1 688 764 A2 | 8/2006 |
| EP | 1 967 891 A1 | 9/2008 |
| EP | 2 078 977 A1 | 7/2009 |
| JP | 59-121001 | 7/1984 |
| JP | 63-081402 | 4/1988 |
| JP | 03-102301 | 4/1991 |
| JP | 03-116101 | 5/1991 |
| JP | H4-55615 | 9/1992 |
| JP | 2768996 B | 6/1998 |
| JP | 11-30703 | 2/1999 |
| JP | 2001-290112 | 10/2001 |
| JP | 2002-296406 | 10/2002 |
| JP | 2003-105218 | 4/2003 |
| JP | 2003-121604 | 4/2003 |
| JP | 2003-121734 | 4/2003 |
| JP | 2003-215302 | 7/2003 |
| JP | 2005-011417 | 1/2005 |
| JP | 2005-215038 | 8/2005 |
| JP | 2006-251760 | 9/2006 |
| JP | 2007-127681 | 5/2007 |
| JP | 2007-183411 | 7/2007 |
| JP | 2008-152069 | 7/2008 |
| JP | 2008-241746 | 10/2008 |
| JP | 2009-098184 | 5/2009 |
| JP | 2009-530687 | 8/2009 |
| JP | 2009-251008 | 10/2009 |
| JP | 2010-511205 | 4/2010 |
| JP | 2010-148860 | 7/2010 |
| WO | WO 2007/077641 | 7/2007 |
| WO | WO 2007/109202 A2 | 9/2007 |
| WO | WO 2008/053712 A1 | 5/2008 |
| WO | WO 2008/067109 A1 | 6/2008 |
| WO | WO2008/067109 A1 | 6/2008 |
| WO | WO 2010/016242 A1 | 2/2010 |

OTHER PUBLICATIONS

Chinese Office Action, issued in corresponding Chinese Patent Application No. 201180053968.5, dated Feb. 17, 2014, 29 pages.
Notice of Reasons for Rejection issued by the Japanese Patent Office in Japanese Application No. 2010-288319, dated Oct. 9, 2012, 9 pages.
Decision of Rejection issued by the Japanese Patent Office in Japanese Application No. 2010-288319, dated Nov. 27, 2012, 9 pages.
"Notice of Reasons for Rejection", issued in corresponding Japanese Patent Application No. 2013-026090, dated Jan. 16, 2014, 7 pages.
Japanese Office Action, issued in corresponding Japanese Patent Application No. 2011-80053968.5, dated Feb. 17, 2014, 16 pages.
Written Opinion of the International Searching Authority issued by the Japanese Patent Office in corresponding International Application No. PCT/JP2011/070856, dated Nov. 29, 2011, 10 pages.
International Search Report issued by the Japanese Patent Office in corresponding International Application No. PCT/JP2011/070856, dated Nov. 29. 2011, 4 pages.
Official Inquiry issued by the Japanese Patent Office in Appeal No. 2013-002864, related to International Application No. 2010-288319, dated May 7, 2013, 10 pages.
Appeal Decision issued by the Japanese Patent Office in Appeal No. 2013-002864, related to Japanese Application No. 2010-288319, 58 pages, dated Sep. 3, 2013.
Notice of Preliminary Rejection issued by the Korean Intellectual Property Office in Korean Application No. 10-2013-7009773, dated May 19, 2014 (14 pages).
Notification, Submission of Information issued by the Japanese Patent Office in Japanese Patent Application No. 2013-026090, dated Jul. 8, 2014, 24 pages.
Turner, P. L., et al., "Circadian photoreception: ageing and the eye's important role in systemic health", Br. J Ophthalmol, 92, pp. 1439-1444 (2008).
Algvere, P. V., et al., "Age-related maculopathy and the impact of blue light hazard", Acta Ophthalmol. Scand., 84, pp. 4-15 (2006).
Office Action issued by Canadian Intellectual Property Office in counterpart foreign Application No. 2,812,742 (PCT Application No. JP2011070856), 4 pages, dated Feb. 12, 2015.
Office Action issued by the Canadian Intellectual Property Office in counterpart foreign Application No. 2,812,742 (PCT Application No. JP2011070856), 3 pages, dated Oct. 21, 2015.
Anonymous: "Reflectance—Wikipedia, the free encyclopedia," Feb. 6, 2016 (Feb. 6, 2016).
International Search Report issued by the European Patent Office in counterpart foreign Application No. 11828778.8 (PCT Application No. JP2011070856), dated Mar. 2, 2016, 9 pages.
Shree Nayar et al., "Basic Principles of Surface Reflectance Lecture #3," Feb. 23, 2016 (Feb. 23, 2016).
European Office Action issued in European Application No. 11828778.8, dated Mar. 14, 2018.

\* cited by examiner

OPTICAL COMPONENT AND METHOD OF MANUFACTURING THE SAME

CROSS-REFERENCE TO RELATED APPLICATION

This is a continuation application of International Application No. PCT/JP2011/070856, filed on Sep. 13, 2011, which claims priority to Japanese Patent Application No. 2010-218711, filed Sep. 29, 2010, and Japanese Patent Application No. 2010-288319, filed Dec. 24, 2010, the contents of which are incorporated herein by reference.

BACKGROUND

Field of the Invention

The present invention relates to an optical component and a method of manufacturing the optical component.

Description of the Related Art

In recent years, for spectacle lenses, plastic lenses have been used in many cases due to advantages such as light-weight, excellent impact resistance, and ease of dyeing. In the plastic lens for use in a spectacle lens, an antireflection film is generally provided on both sides of the plastic lens for the purpose of preventing surface reflection. Generally, the antireflection film for a spectacle lens has a low reflection characteristic (wideband low-reflection characteristic) over the entire visible region of 400 nm to 700 nm.

In the case of an optical component such as a spectacle lens, an optical component which is provided with a plastic base and an antireflection film disposed on the base as disclosed in, for example, Japanese Unexamined Patent Application, First Publication No. H11-30703, Japanese Unexamined Patent Application, First Publication No. 2006-251760 and Japanese Unexamined Patent Application, First Publication No. 2007-127681 is known.

SUMMARY

However, from recent studies, it is known that the low reflection characteristic over the entire visible region is not necessarily desirable for visibility and eye health. Glare is reduced, and visibility and contrast are improved by cutting the blue region (380 nm to 500 nm) of visible light.

In addition, regarding eye health, since the blue region (380 nm to 500 nm) of visible light has a high intensity of energy, it is said to be a cause of impact to the retina and the like. The impact caused by blue light is referred to as "blue light hazard". Particularly, the most undesired region is about 435 nm to about 440 nm, and it is said that it is desirable to cut the light in this region.

Recently, in liquid crystal screens that have become the mainstream of displays and LED illumination, a lot of light with a wavelength of about 450 nm is emitted, and thus control of such light rays in the blue region has attracted attention. As means for cutting the blue region (380 nm to 500 nm) of visible light, a dyed lens such as sunglasses is known. However, in the dyed lens, the entire visible region is cut, and thus visibility deteriorates due to a reduction in light intensity.

An object of an aspect of the invention is to provide an optical component which has an antiglare effect, is effective for a reduction in feeling of fatigue and prevention of eye trouble, and is excellent in visibility, and a method of manufacturing the optical component.

Solution To Problem

An optical component according to an aspect of the invention includes: a plastic base which has a convex surface and a concave surface; and a multilayer film which is disposed on at least the convex surface of the plastic base, the multilayer film having an average reflectivity of 2% to 10% over a wavelength range of 400 nm to 500 nm.

In addition, a method of manufacturing an optical component according to an aspect of the invention is a method of manufacturing the optical component which includes a plastic base which has a convex surface and a concave surface and a multilayer film which is disposed on at least the convex surface of the plastic base. The method includes the steps of heating the plastic base; and forming the multilayer film on the plastic base after adjusting the temperature of the plastic base to a predetermined temperature by the heating step. The step of forming the multilayer film has a process of forming a high refractive index layer having a multilayer structure by alternately applying a high refractive index material and a low refractive index material in multilayers, and a process of forming, on the high refractive index layer, a low refractive index layer having a lower refractive index than that of the high refractive index layer, and wherein an average reflectivity of the multilayer film over a wavelength range of 400 nm to 500 nm is 2% to 10%.

According to an optical component of the aspect of the invention, a sufficient antiglare effect is obtained while maintaining excellent visibility.

In addition, according to a method of manufacturing an optical component of the aspect of the invention, an optical component with reduced glare, with which it is easy to see, and which has optical characteristics effective for prevention of fatigue and eye trouble can be provided.

DESCRIPTION OF EMBODIMENTS

Hereinafter, embodiments of the invention will be described in detail.

The embodiments are described in detail to achieve a better understanding of the points of the invention, but the invention is not limited thereto unless otherwise stated.

(1) First Embodiment

Figure 1:
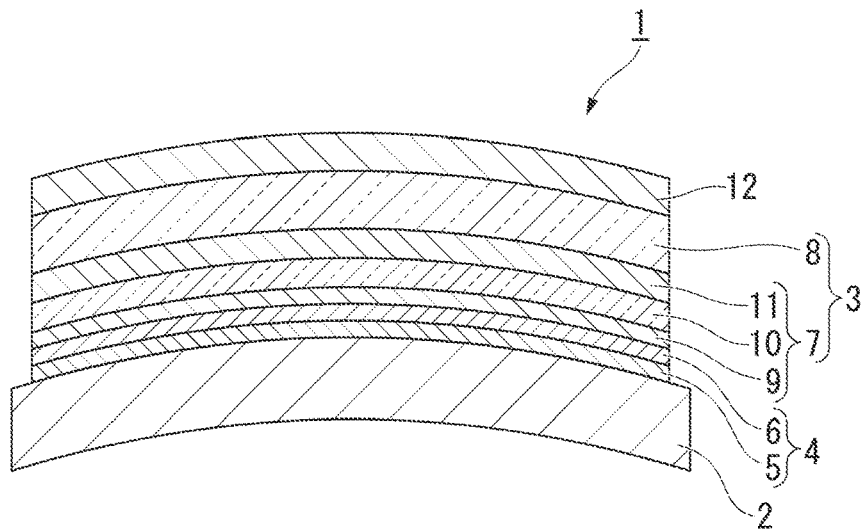
FIG. 1 is a schematic diagram showing an example of an optical component according to a first embodiment.

FIG. 1 is a sectional side view schematically showing an optical component of a first embodiment of the invention. The reference numeral 1 represents an optical component for a spectacle lens.

The optical component 1 is provided with a plastic base 2 and an inorganic multilayer film 3 disposed on a convex surface of the plastic base 2. In this embodiment, a functional thin film 4 is disposed between the convex surface of the plastic base 2 and the inorganic multilayer film 3. In this embodiment, the functional thin film 4 is formed of a primer layer 5 and a hard coating layer 6.

In the following description, the films 3 and 4, which are disposed on the surface (convex surface) of the plastic base 2, will mainly be described. However, actually, films which are the same as the films 3 and 4 formed on the surface (convex surface) are also formed on the rear surface (concave surface) of the plastic base 2.

The plastic base 2 is made of, for example, transparent plastic such as an acryl-based resin, a thiourethane-based resin, a methacryl-based resin, an allyl-based resin, an episulfide-based resin, a polycarbonate-based resin, a polyurethane-based resin, a polyester-based resin, a polystyrene-based resin, an episulfide resin, a polyethersulfone resin, a poly-4-methylpentene-1 resin, a diethylene glycol bis allyl carbonate resin (CR-39), a polyvinyl chloride resin, a halogen-containing copolymer, and a sulfur-containing copolymer. In addition, in this embodiment, for example, one of 1.50, 1.60, 1.67, and 1.74 is selected and used as a refractive index (nd) of the plastic base 2. When the refractive index of the plastic base 2 is set to 1.6 or greater, an allyl carbonate-based resin, an acrylate-based resin, a methacrylate-based resin, a thiourethane-based resin and the like are preferably used for the plastic base 2. In addition, the plastic base 2 may not be transparent, or may be colored if it is translucent. The transmissivity of the colored plastic base 2 is preferably 5% to 85%.

The functional thin film 4 is disposed between the plastic base 2 and the inorganic multilayer film 3 as described above, and is formed of the primer layer 5 which is disposed to be brought into contact with the plastic base 2 and the hard coating layer 6 which is disposed to be brought into contact with the primer layer 5 and the inorganic multilayer film 3.

The primer layer 5 is used to improve the adhesion between the plastic base 2 and the hard coating layer 6 and functions as an adhesion layer. In addition, the primer layer 5 is also used to absorb the impact on the optical component 1 and functions as an impact absorption layer.

The primer layer 5 contains a polyurethane-based resin as a main component, and in this embodiment, the primer layer 5 is a polyurethane-based resin containing, for example, particulates of an inorganic material. The primer layer 5 may include at least one type of an acryl-based resin, a methacryl-based resin, and an organosilicon-based resin. The thickness (actual thickness) of the primer layer 5 is preferably about 0.5 μm to about 1.0 μm.

Such a primer layer 5 can be formed with a predetermined thickness on the plastic base 2 by dipping the plastic base 2 in a liquid for forming the primer layer 5 and then lifting and drying the plastic base 2. As the liquid for forming the primer layer 5, for example, a liquid in which a resin to be the primer layer 5 and an inorganic oxide particulate sol are dispersed or dissolved in water or an alcohol-based solvent and mixed therewith can be used.

Since the hard coating layer 6 has a function of protecting the plastic base 2 and suppressing impact to the plastic base 2, it functions as an abrasion-resistant film.

The hard coating layer 6 is formed of, for example, an organosiloxane-based hard coating layer. The organosiloxane-based hard coating layer is a layer in which particulates of inorganic oxide are dispersed in an organosiloxane-based resin. As the inorganic oxide, for example, rutile-type titanium oxide and oxides of silicon, tin, zirconium, and antimony are preferably used. In addition, for example, as disclosed in Japanese Examined Patent Application, Second Publication No. H4-55615, a colloidal silica-containing organosilicon-based resin may be used as the hard coating layer 6. The thickness (actual thickness) of the hard coating layer 6 is preferably about 2 μm to about 4 μm.

The hard coating layer 6 can be formed with a predetermined thickness on the primer layer 5 on the plastic base 2 by dipping the plastic base 2 having the primer layer 5 formed thereon in a liquid for forming the hard coating layer 6 and then lifting and drying the plastic base 2. As the liquid for forming the hard coating layer 6, for example, a liquid in which a resin to be the hard coating layer 6 and an inorganic oxide particulate sol are dispersed or dissolved in water or an alcohol-based solvent and mixed therewith can be used.

When the refractive index of the functional thin film 4 including the primer layer 5 and the hard coating layer 6 and the refractive index of the plastic base 2 are almost the same as each other, it is possible to suppress a reduction in transmissivity and the occurrence of interference fringes which are caused by the reflection at an interface between the functional thin film 4 and the plastic base 2. Accordingly, it is desirable to adjust the refractive index of the functional thin film 4 in accordance with the refractive index of the plastic base 2. The refractive index of the functional thin film 4 (primer layer 5 and hard coating layer 6) can be adjusted by selecting the type (physical properties) of resin which is a main component of the functional thin film 4, or by selecting the type (physical properties) of particulates added to the resin which is a main component.

In this embodiment, the functional thin film 4 is formed to include the primer layer 5 and the hard coating layer 6. However, for example, one or both of the primer layer 5 and the hard coating layer 6 may be omitted. In addition, as a constituent film of the functional thin film 4, for example, a dielectric film and a metallic film made of indium tin oxide (ITO) or the like may be disposed in addition to the primer layer 5 and the hard coating layer 6.

In addition, in this embodiment, a dielectric film or a metallic film having a thickness of 20 nm or less may be disposed between a high refractive index inorganic material and a low refractive index inorganic material constituting the inorganic multilayer film. The thickness of the dielectric film or the metallic film may be 10 nm or less.

The inorganic multilayer film 3 has a double-layer configuration which has a high refractive index layer 7 having a multilayer structure in which a high refractive index inorganic material and a low refractive index inorganic material are alternately applied in multilayers and a low refractive index layer 8 made of a low refractive index inorganic material having a lower refractive index than that of the high refractive index layer 7 on the high refractive index layer 7. The inorganic multilayer film 3 functions as an antireflection film which prevents the reflection of incident light. In this embodiment, the inorganic multilayer film 3 is designed to have an average reflectivity of 2% to 10% over a wavelength range of 400 nm to 500 nm.

When the average reflectivity is in such a range, a sufficient antiglare effect is obtained and excellent visibility can be maintained in use as a spectacle lens. When the average reflectivity over the wavelength region is 10% or greater, a person wearing such glasses can experience glare due to the reflection of incident light, particularly from the concave surface of the spectacle lens. Therefore, the average reflectivity is preferably 3% to 10%.

In addition, in this embodiment, an inorganic multilayer film is used as a multilayer film. However, an organic multilayer film may be used as long as the advantageous effect of the invention is not impaired.

Furthermore, the inorganic multilayer film 3 is preferably designed to have a reflectivity of 1.5% or less over a wavelength region of 580 nm to 780 nm. Due to such a design, a spectacle lens which has a more effective antiglare effect and better visibility can be obtained.

In this embodiment, the high refractive index layer 7 is formed of a first layer 9 made of a high refractive index inorganic material which is provided close to the plastic base 2, a second layer 10 made of a low refractive index inorganic material which is provided on the first layer 9, and a third layer 11 made of a high refractive index inorganic material which is provided on the second layer 10.

The first layer 9 is provided to be brought into contact with the hard coating layer 6, and is made of zirconium dioxide ($ZrO_2$) having a refractive index of 2.0. Other than $ZrO_2$, for example, titanium dioxide ($TiO_2$) and tantalum dioxide ($Ta_2O_5$) can be used as the high refractive index inorganic material constituting the first layer 9. Furthermore, the first layer 9 can also be made of oxide of an alloy of plural types including zirconium, titanium, and tantalum. In addition to these, for example, aluminum oxide ($Al_2O_3$), yttrium dioxide ($Y_2O_3$), hafnium dioxide ($HfO_2$), and niobium dioxide ($Nb_2O_5$) can also be used.

Here, in this manner, when the first layer 9 is made of a high refractive index inorganic material ($ZrO_2$), the adhesion between the first layer 9 and the hard coating layer 6 can be obtained. That is, this is because the adhesion (adhesion power) between the layer ($ZrO_2$) made of a high refractive index inorganic material and the hard coating layer 6 is greater than the adhesion (adhesion power) between the layer ($SiO_2$) made of a low refractive index inorganic material and the hard coating layer 6. In addition, even when the functional thin film 4 (primer layer 5 and hard coating layer 6) is omitted, the adhesion (adhesion power) between the high refractive index layer ($ZrO_2$) and the plastic base 2 is greater than the adhesion (adhesion power) between the low refractive index layer ($SiO_2$) and the plastic base 2, and thus using a high refractive index inorganic material is better for adhesion.

The second layer 10 is provided to be brought into contact with the first layer 9, and is made of silicon dioxide ($SiO_2$) having a refractive index of 1.47. Other than $SiO_2$, for example, $MgF_2$ having a refractive index of 1.36 can be used as the low refractive index inorganic material constituting the second layer 10.

The third layer 11 is provided to be brought into contact with the second layer 10, and is made of zirconium dioxide ($ZrO_2$) as in the first layer 9. As in the first layer 9, the third layer 11 can be made of a high refractive index inorganic material other than $ZrO_2$.

In addition, the high refractive index layer 7 can be formed not to have a three-layer structure of the first layer 9, the second layer 10, and the third layer 11 as described above, but to be configured in two layers or in four or more layers if the above-described reflectivity condition is satisfied.

The low refractive index layer 8 is provided to be brought into contact with the third layer 11, and is made of silicon dioxide ($SiO_2$) as in the second layer 10.

In addition, in this embodiment, on the inorganic multilayer film 3, that is, on the outermost layer (low refractive index layer 8) of the inorganic multilayer film 3 which is most distant from the plastic base 2, a water-and-oil repellent film 12 including a fluorine-substituted alkyl group-containing organosilicon compound is provided.

The water-and-oil repellent film 12 contains the fluorine-substituted alkyl group-containing organosilicon compound as a main component, and has liquid repellency (water repellency and oil repellency). That is, the water-and-oil repellent film 12 reduces the surface energy of the optical component to exhibit a function of preventing misting and contamination, and improves the sliding property of the surface of the optical component. As a result, abrasion resistance can be improved.

As the fluorine-substituted alkyl group-containing organosilicon compound, one of the following general formulas (1) to (6) is selected:

[Chem. 1]

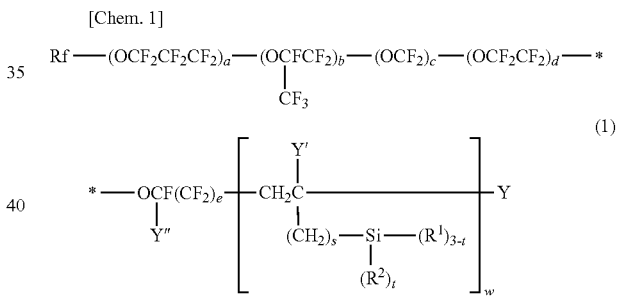

(in the formula (1), Rf represents a straight or branched perfluoroalkyl group with 1 to 16 carbon atoms, Y represents iodine or hydrogen, Y' represents hydrogen or a lower alkyl group with 1 to 5 carbon atoms, Y" represents fluorine or a trifluoromethyl group, $R^1$ represents a hydrolyzable group, $R^2$ represents hydrogen or an inert monovalent organic group, a, b, c, and d each represents an integer of 0 to 200, e represents 0 or 1, s and t each represents an integer of 0 to 2, and w represents an integer of 1 to 10);

[Chem. 2]

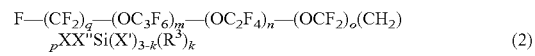

[Chem. 3]

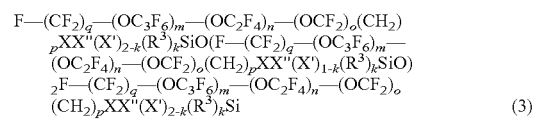

[Chem. 4]

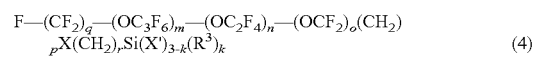

[Chem. 5]

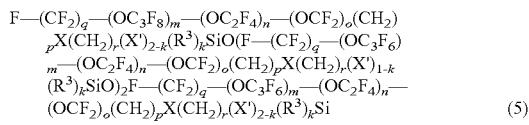

(in the formulas (2) to (5), X represents oxygen or a divalent organic group, X' represents a hydrolyzable group, X" represents a divalent organosilicon group, $R^3$ represents a straight or branched alkylene group with 1 to 22 carbon atoms, q represents an integer of 1 to 3, m, n, and o each represents an integer of 0 to 200, p represents 1 or 2, r represents an integer of 2 to 20, k represents an integer of 0 to 2, and z represents an integer of 0 to 10 when k is 0 or 1); and

[Chem. 6]

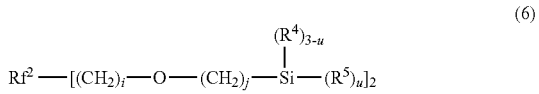

(in the formula (6), $Rf^2$ represents a divalent straight perfluoropolyether group, $R^4$ represents a phenyl group or an alkyl group with 1 to 4 carbon atoms, $R^5$ represents a hydrolyzable group, i represents an integer of 0 to 2, j represents an integer of 1 to 5, and u represents 2 or 3).

Here, in order to give excellent durability to the water-and-oil repellent film 12, the fluorine-substituted alkyl group-containing organosilicon compound selected from among the general formulas (1) to (5) and the fluorine-substituted alkyl group-containing organosilicon compound selected from the general formula (6) are preferably combined and used.

As the fluorine-substituted alkyl group-containing organosilicon compound shown in the general formulas (1) to (5), Optool DSX and Optool AES4 manufactured by Daikin Industries, Ltd., and the like can be used. In addition, as the fluorine-substituted alkyl group-containing organosilicon compound shown in the general formula (6), KY-130 and KY-164 manufactured by Shin-Etsu Chemical Co., Ltd., and the like can be used.

(2) Second Embodiment

Figure 2:
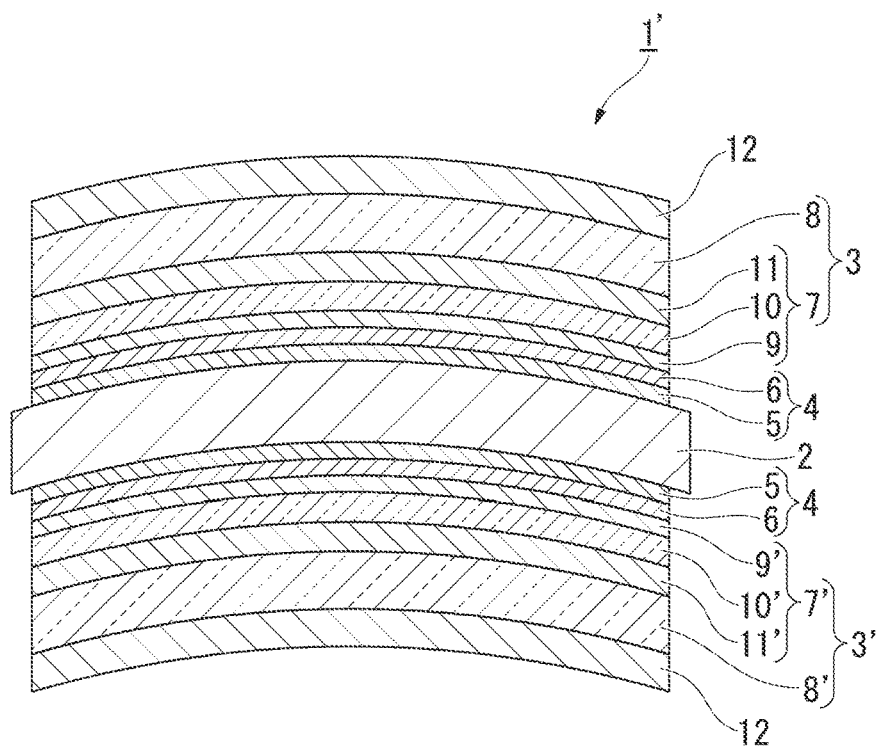
FIG. 2 is a schematic diagram showing an example of an optical component according to a second embodiment.

FIG. 2 is a sectional side view schematically showing an optical component of a second embodiment of the invention. The reference numeral 1' represents an optical component for a spectacle lens. In FIG. 2, the same constituent elements as in the optical component 1 shown in FIG. 1 will be denoted by the same reference numerals, and descriptions thereof will be omitted.

The optical component 1' is provided with, in addition to the structure of the optical component 1 of the first embodiment, an inorganic multilayer film 3' disposed on a concave surface of a plastic base 2. In this embodiment, a functional thin film 4 is disposed between the concave surface of the plastic base 2 and the inorganic multilayer film 3'. The functional thin film 4 is formed of a primer layer 5 and a hard coating layer 6 in this embodiment.

The inorganic multilayer film 3' has a double-layer configuration which has a high refractive index layer 7' having a multilayer structure in which a high refractive index inorganic material and a low refractive index inorganic material are alternately applied in multilayers, and a low refractive index layer 8' made of a low refractive index inorganic material having a lower refractive index than that of the high refractive index layer 7' on the high refractive index layer 7'.

In this embodiment, the high refractive index layer 7' is formed of a first layer 9' made of a high refractive index inorganic material which is provided close to the plastic base 2, a second layer 10' made of a low refractive index inorganic material which is provided on the first layer 9', and a third layer 11" made of a high refractive index inorganic material which is provided on the second layer 10' as in the first embodiment.

In this embodiment, examples of the inorganic materials which are used in the first layer 9', the second layer 10', and the third layer 11' include the same materials as the inorganic materials which are used in the first layer 9, the second layer 10, and the third layer 11 in the first embodiment.

Like the high refractive index layer 7 in the first embodiment, the high refractive index layer 7' can be formed not to have a three-layer structure, but to be configured in two layers or in four or more layers.

In this embodiment, like the inorganic multilayer film 3 in the first embodiment, the inorganic multilayer film 3' may be designed to have an average reflectivity of 2% to 10% over a wavelength range of 400 nm to 500 nm. Furthermore, the inorganic multilayer film 3' is preferably designed to have a reflectivity of 1.5% or less over a wavelength region of 580 nm to 780 nm. When an inorganic multilayer film satisfying such a reflectivity condition is disposed on both sides of the plastic base 2, a spectacle lens which has an antiglare effect and is more effective for visibility can be obtained.

In addition, in this embodiment, the inorganic multilayer film 3' may be the same as a conventional antireflection film. That is, the inorganic multilayer film 3' may be an antireflection film having an average reflectivity of 1.5% or less over a wavelength range of 380 nm to 780 nm.

Furthermore, in this embodiment, the average reflectivity of an inorganic multilayer film 3 disposed on a convex surface of the plastic base 2 over a wavelength range of 400 nm to 500 nm may be greater than the average reflectivity of the inorganic multilayer film 3' disposed on the concave surface of the plastic base 2 over a wavelength range of 400 nm to 500 nm. The inorganic multilayer film 3 disposed on the convex surface of the plastic base 2 is preferably designed to have an average reflectivity of 5% to 10% over a wavelength range of 400 nm to 500 nm, and the inorganic multilayer film 3' disposed on the concave surface of the plastic base 2 is preferably designed to have an average reflectivity of 2% to 4% over a wavelength range of 400 nm to 500 nm. When an inorganic multilayer film satisfying such a reflectivity condition is disposed, a spectacle lens which has a more effective antiglare effect can be obtained. The inorganic multilayer film 3' disposed on the concave surface of the plastic base 2 may have an average reflectivity of 3% to 4% over a wavelength range of 400 nm to 500 nm.

In this embodiment, the functional thin film 4 is formed to include the primer layer 5 and the hard coating layer 6. However, as in the first embodiment, for example, one or both of the primer layer 5 and the hard coating layer 6 may be omitted. In addition, as a constituent film of the functional thin film 4, for example, a dielectric film and a metallic film made of indium tin oxide (ITO) or the like may be disposed in addition to the primer layer 5 and the hard coating layer 6.

In addition, in this embodiment, a dielectric film or a metallic film having a thickness of 20 nm or less may be disposed between a high refractive index inorganic material and a low refractive index inorganic material constituting the inorganic multilayer film. The thickness of the dielectric film or the metallic film may be 10 nm or less.

In addition, in this embodiment, an inorganic multilayer film is used as a multilayer film. However, an organic multilayer film may be used as long as the advantageous effect of the invention is not impaired.

Next, a method of manufacturing the optical component according to an embodiment of the invention will be described.

The method of manufacturing the optical component in this embodiment is provided with a step of forming the functional thin film 4 (primer layer 5 and hard coating layer 6) on the plastic base 2 by a method which is the same as in the conventional case, a step of heating the plastic base 2, a step of forming the inorganic multilayer film 3 on the plastic base 2 after adjusting the temperature of the plastic base 2 to a predetermined temperature (for example, 70 degrees Celsius) by the heating step, and a step of forming the water-and-oil repellent film 12 on the inorganic multilayer film 3.

The step of forming the inorganic multilayer film 3 has a process of forming the high refractive index layer 7 having a multilayer structure by alternately applying a high refractive index inorganic material and a low refractive index inorganic material in multilayers, and a process of forming, on the high refractive index layer 7, the low refractive index layer 8 made of a low refractive index inorganic material. A vacuum deposition method is preferably used to form the layers.

Figure 3:
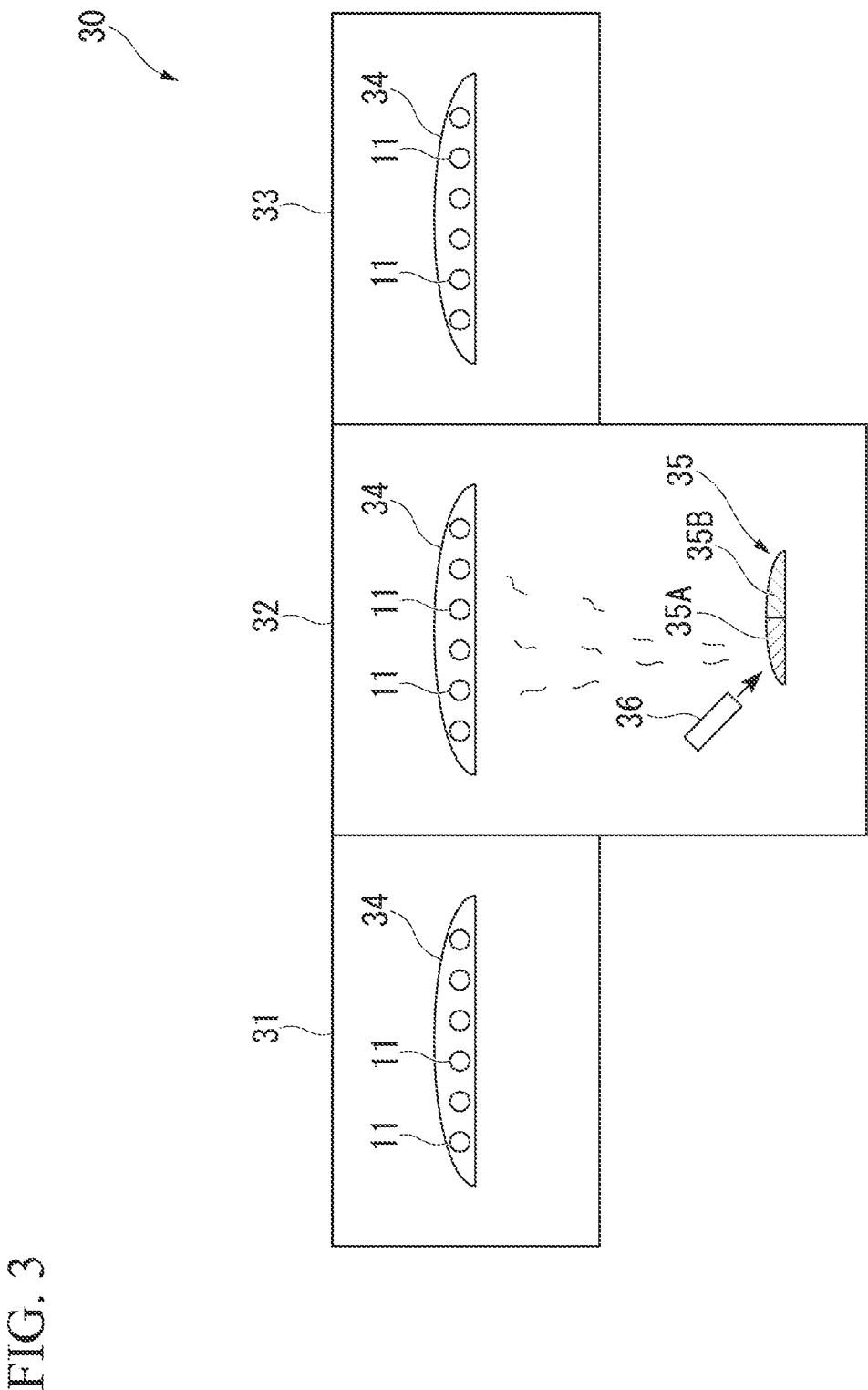
FIG. 3 is a schematic diagram showing an example of a deposition device according to the first embodiment.

FIG. 3 is a diagram showing an example of a deposition device 30 for forming the layers of the inorganic multilayer film 3. As shown in FIG. 3, the deposition device 30 is provided with a first chamber 31, a second chamber 32, and a third chamber 33. The inside of each of the first, second, and third chambers 31, 32, and 33 is decompressed almost to vacuum and held in that state. In addition, in the deposition device 30, the internal temperature of each of the first, second, and third chambers 31, 32, and 33 is adjustable using temperature-adjusting means (not shown).

The deposition device 30 is provided with a holding member 34 in the internal space of each of the first, second, and third chambers 31, 32, and 33. The holding member 34 has a curved upper surface (holding surface) and is rotatable. On the upper surface thereof, a plurality of plastic bases 2 is held.

For example, by irradiating a first deposition source 35A with beams, $ZrO_2$ vapor is ejected from the first deposition source 35A and supplied to be deposited onto the plastic base 2 which is held on the holding member 34. Accordingly, the first layer 9 and the third layer 11 in the high refractive index layer 7 of the inorganic multilayer film 3 can be formed. Similarly, by irradiating a second deposition source 35B with beams, $SiO_2$ vapor is ejected from the second deposition source 35B and supplied to be deposited onto the plastic base 2 which is held on the holding member 34. Accordingly, the second layer 10 in the high refractive index layer 7 of the inorganic multilayer film 3 and the low refractive index layer 8 can be formed.

That is, by alternately performing the irradiation of the first deposition source 35A with beams and the irradiation of the second deposition source 35B with beams, a layer made of a high refractive index inorganic material and a layer made of a low refractive index inorganic material can be alternately formed and applied on the plastic base 2 which is held on the holding member 34. However, in the invention, the inorganic multilayer film 3 is designed to have an average reflectivity of 2% to 10% over a wavelength range of 400 nm to 500 nm. Furthermore, the inorganic multilayer film 3 is preferably designed to have a reflectivity of 1.5% or less over a wavelength region of 580 nm to 780 nm.

A deposition source made of zirconium oxide (ZrO) may be used as the first deposition source 35A and the first deposition source 35A may be irradiated with beams while introducing oxygen to the internal space of the second chamber 32 to form a high refractive index inorganic material layer made of zirconium dioxide ($ZrO_2$).

When the inorganic multilayer film 3 is formed in this manner, the water-and-oil repellent film 12 is formed thereon.

Examples of the method of forming the water-and-oil repellent film 12 include wet methods such as a dipping method, a spin-coating method and a spray method, and dry methods such as a vacuum deposition method.

Generally, a dipping method is frequently used from among the wet methods. This method is a method in which an optical component with the inorganic multilayer film 3 formed thereon is dipped in a liquid in which a fluorine-substituted alkyl group-containing organosilicon compound is dissolved in an organic solvent, and is lifted under a predetermined condition to be dried to thereby form a film. As the organic solvent, perfluorohexane, perfluoro-4-methoxybutane, perfluoro-4-ethoxybutane, m-xylene hexafluoride, and the like is used.

The dilute concentration achieved using the organic solvent is preferably 0.01 wt % to 0.5 wt %, and is more preferably 0.03 wt % to 0.1 wt %. When the concentration is too low, the water-and-oil repellent film 12 having a sufficient film thickness is not obtained. In addition, when the concentration is too high, uneven coating easily occurs and material costs also increase.

A vacuum deposition method is frequently used from among dry methods. This method is a method in which a fluorine-substituted alkyl group-containing organosilicon compound is heated and evaporated in a vacuum chamber to form the water-and-oil repellent film 12.

In the optical component 1 formed in this manner, the inorganic multilayer film 3 is designed to have an average reflectivity of 2% to 10% over a wavelength range of 400 nm to 500 nm, and thus excellent reflection characteristics and visibility could be achieved as described above.

In addition, in the method of manufacturing the optical component, such an excellent optical component with good balance can be securely provided.

EXAMPLES

Hereinafter, examples of the embodiments of the invention will be described in more detail, but the invention is not limited to the following examples.

Test 1

On a urethane-based synthetic resin substrate, a silicon-based hard coating having a refractive index of 1.67 and a primer coating having a refractive index of 1.67 were prepared by thermal curing, and film formation was performed by a vacuum deposition method as follows.

Example 1

Convex Surface: A lens was set in a rotating dome provided in a vacuum chamber, the temperature in the vacuum chamber was adjusted to 70 degrees Celsius by heating, air was exhausted until the pressure was adjusted to $1.0 \times 10^{-3}$ Pa, and Ar ion beam cleaning was carried out for 60 seconds under conditions of an acceleration voltage of 500 V and an acceleration current of 100 mA. Then, a first layer $ZrO_2$ (refractive index 2.00) having an optical film thickness of $0.035\lambda$, a second layer $SiO_2$ (refractive index 1.47) having an optical film thickness of $0.565\lambda$, a third layer $ZrO_2$ (refractive index 2.00) having an optical film thickness of $0.075\lambda$, a fourth layer $SiO_2$ (refractive index 1.47) having an optical film thickness of $0.04\lambda$, a fifth layer $ZrO_2$ (refractive index 2.00) having an optical film thickness of $0.32\lambda$, and a sixth layer $SiO_2$ (refractive index 1.47) having an optical film thickness of $0.26\lambda$, were sequentially applied from the plastic base side. $\lambda$ is 500 nm in terms of center wavelength of design.

Concave Surface: After the same pretreatment with the same device and the same processing atmosphere as in the case of the convex surface, a first layer $SiO_2$ (refractive index 1.47) having an optical film thickness of $0.10\lambda$, a second layer $ZrO_2$ (refractive index 2.00) having an optical film thickness of $0.16\lambda$, a third layer $SiO_2$ (refractive index 1.47) having an optical film thickness of $0.06\lambda$, a fourth layer $ZrO_2$ (refractive index 2.00) having an optical film thickness of $0.25\lambda$, and a fifth layer $SiO_2$ (refractive index 1.47) having an optical film thickness of $0.28\lambda$ were sequentially applied from the plastic base side. $\lambda$ is 500 nm in terms of center wavelength of design.

Figure 4:
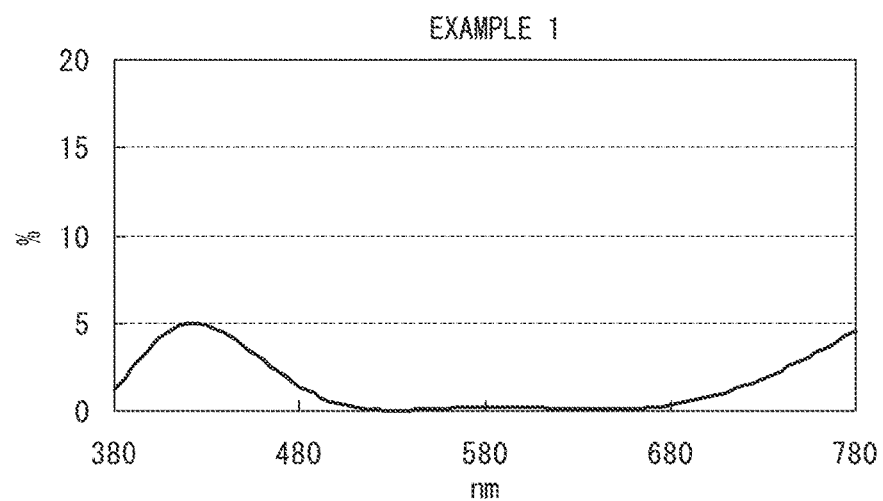
FIG. 4 is a graph showing a spectral characteristic of an antireflection film according to Example 1.

The spectral characteristic in Example 1 is shown in FIG. 4.

Example 2

Convex Surface: A lens was set in a rotating dome provided in a vacuum chamber, the temperature in the vacuum chamber was adjusted to 70 degrees Celsius by heating, air was exhausted until the pressure was adjusted to $1.0\times10^{-3}$ Pa, and ion beam cleaning was carried out for 60 seconds under conditions of an acceleration voltage of 500 V and an acceleration current of 100 mA. Then, a first layer $ZrO_2$ (refractive index 2.00) having an optical film thickness of $0.07\lambda$, a second layer $SiO_2$ (refractive index 1.47) having an optical film thickness of $0.59\lambda$, a third layer $ZrO_2$ (refractive index 2.00) having an optical film thickness of $0.06\lambda$, a fourth layer $SiO_2$ (refractive index 1.47) having an optical film thickness of $0.04\lambda$, a fifth layer $ZrO_2$ (refractive index 2.00) having an optical film thickness of $0.3\lambda$, and a sixth layer $SiO_2$ (refractive index 1.47) having an optical film thickness of $0.265\lambda$, were sequentially applied from the plastic base side. $\lambda$ is 500 nm in terms of center wavelength of design.

Concave Surface: After the same pretreatment with the same device and the same processing atmosphere as in the case of the convex surface, a first layer $SiO_2$ (refractive index 1.47) having an optical film thickness of $0.10\lambda$, a second layer $ZrO_2$ (refractive index 2.00) having an optical film thickness of $0.16\lambda$, a third layer $SiO_2$ (refractive index 1.47) having an optical film thickness of $0.06\lambda$, a fourth layer $ZrO_2$ (refractive index 2.00) having an optical film thickness of $0.25\lambda$, and a fifth layer $SiO_2$ (refractive index 1.47) having an optical film thickness of $0.28\lambda$ were sequentially applied from the plastic base side. $\lambda$ is 500 nm in terms of center wavelength of design.

Figure 5:
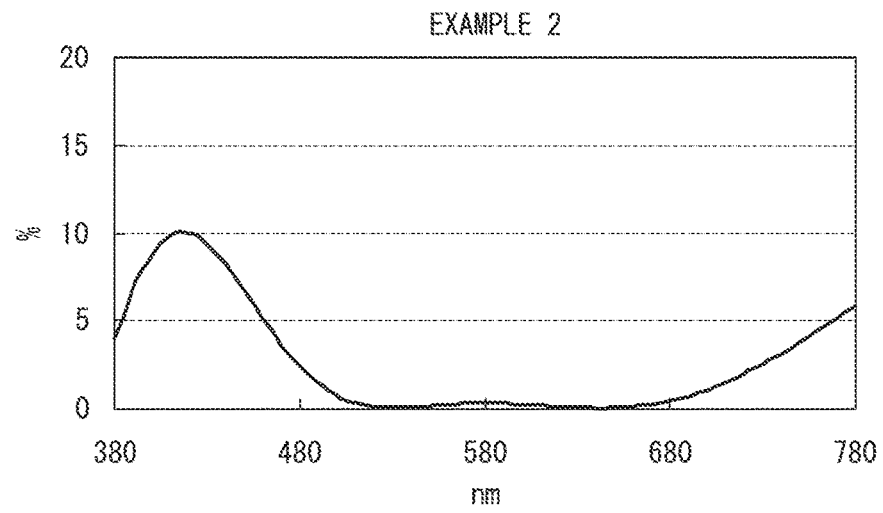
FIG. 5 is a graph showing a spectral characteristic of an antireflection film according to Example 2.

The spectral characteristic in Example 2 is shown in FIG. 5.

Example 3

Convex Surface: A lens was set in a rotating dome provided in a vacuum chamber, the temperature in the vacuum chamber was adjusted to 70 degrees Celsius by heating, air was exhausted until the pressure was adjusted to $1.0\times10^{-3}$ Pa, and ion beam cleaning was carried out for 60 seconds under conditions of an acceleration voltage of 500 V and an acceleration current of 100 mA. Then, a first layer $ZrO_2$ (refractive index 2.00) having an optical film thickness of $0.095\lambda$, a second layer $SiO_2$ (refractive index 1.47) having an optical film thickness of $0.595\lambda$, a third layer $ZrO_2$ (refractive index 2.00) having an optical film thickness of $0.05\lambda$, a fourth layer $SiO_2$ (refractive index 1.47) having an optical film thickness of $0.03\lambda$, a fifth layer $ZrO_2$ (refractive index 2.00) having an optical film thickness of $0.305\lambda$, and a sixth layer $SiO_2$ (refractive index 1.47) having an optical film thickness of $0.275\lambda$ were sequentially applied from the plastic base side. $\lambda$ is 500 nm in terms of center wavelength of design.

Concave Surface: After the same pretreatment with the same device and the same processing atmosphere as in the case of the convex surface, a first layer $SiO_2$ (refractive index 1.47) having an optical film thickness of $0.10\lambda$, a second layer $ZrO_2$ (refractive index 2.00) having an optical film thickness of $0.16\lambda$, a third layer $SiO_2$ (refractive index 1.47) having an optical film thickness of $0.06\lambda$, a fourth layer $ZrO_2$ (refractive index 2.00) having an optical film thickness of $0.25\lambda$, and a fifth layer $SiO_2$ (refractive index 1.47) having an optical film thickness of $0.28\lambda$ were sequentially applied from the plastic base side. $\lambda$ is 500 nm in terms of center wavelength of design.

Figure 6:
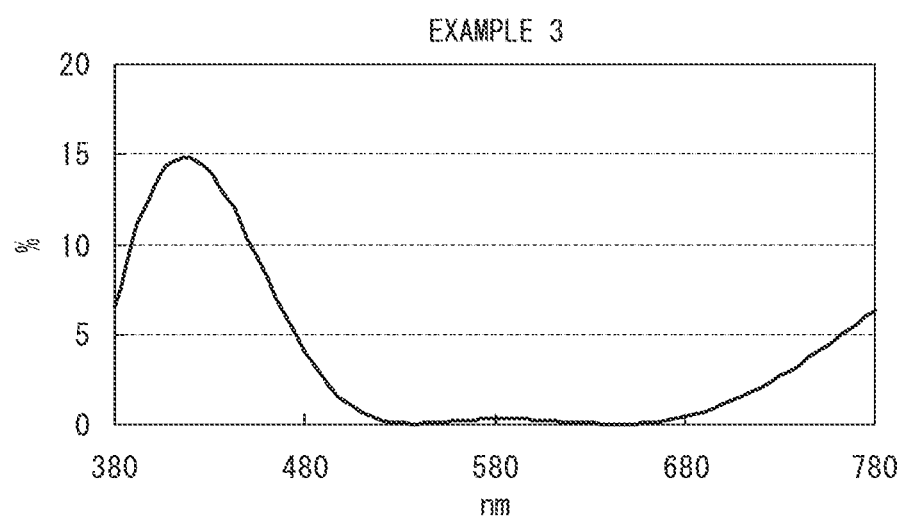
FIG. 6 is a graph showing a spectral characteristic of an antireflection film according to Example 3.

The spectral characteristic in Example 3 is shown in FIG. 6.

Comparative Example 1

Convex Surface and Concave Surface: A lens was set in a rotating dome provided in a vacuum chamber, the temperature in the vacuum chamber was adjusted to 70 degrees Celsius by heating, air was exhausted until the pressure was adjusted to $1.0\times10^{-3}$ Pa, and ion beam cleaning was carried out for 60 seconds under conditions of an acceleration voltage of 500 V and an acceleration current of 100 mA. Then, a first layer $SiO_2$ (refractive index 1.47) having an optical film thickness of $0.10\lambda$, a second layer $ZrO_2$ (refractive index 2.00) having an optical film thickness of $0.16\lambda$, a third layer $SiO_2$ (refractive index 1.47) having an optical film thickness of $0.06\lambda$, a fourth layer $ZrO_2$ (refractive index 2.00) having an optical film thickness of $0.25\lambda$, and a fifth layer $SiO_2$ (refractive index 1.47) having an optical film thickness of $0.28\lambda$ were sequentially applied from the plastic base side. $\lambda$ is 500 nm in terms of center wavelength of design.

Figure 7:
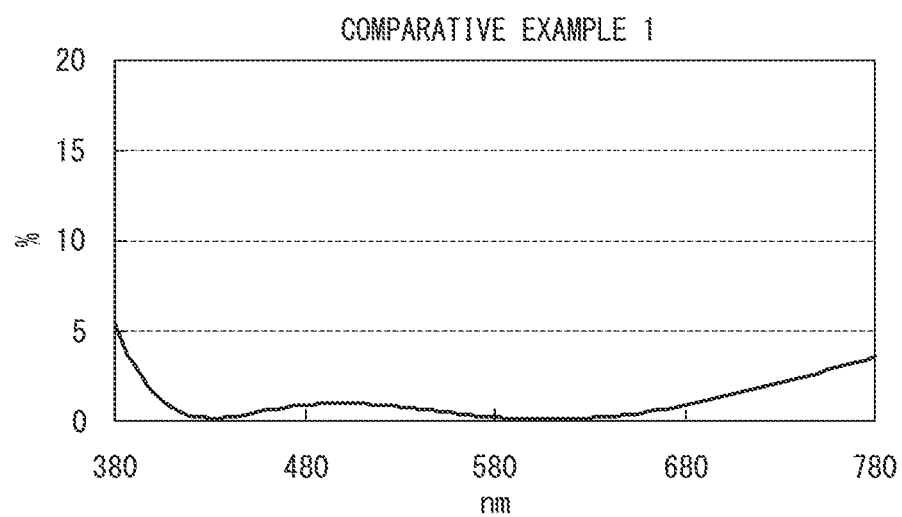
FIG. 7 is a graph showing a spectral characteristic of an antireflection film according to Comparative Example 1.

The spectral characteristic in Comparative Example 1 is shown in FIG. 7.

The formed layers in Examples 1 to 3 and Comparative Example 1 are shown in detail in Table 1.

TABLE 1

<Test 1>

| | <Example 1> | | | <Example 2> | | | <Example 3> | | | <Comparative Example 1> | | |
|---|---|---|---|---|---|---|---|---|---|---|---|---|
| | Material | Optical Film Thickness | Physical Film Thickness (nm) | Material | Optical Film Thickness | Physical Film Thickness (nm) | Material | Optical Film Thickness | Physical Film Thickness (nm) | Material | Optical Film Thickness | Physical Film Thickness (nm) |
| First Layer | $ZrO_2$ | 0.035 λ | 9 | $ZrO_2$ | 0.07 λ | 18 | $ZrO_2$ | 0.095 λ | 24 | $SiO_2$ | 0.10 λ | 33 |
| Second Layer | $SiO_2$ | 0.565 λ | 193 | $SiO_2$ | 0.59 λ | 201 | $SiO_2$ | 0.595 λ | 203 | $ZrO_2$ | 0.16 λ | 39 |
| Third Layer | $ZrO_2$ | 0.075 λ | 19 | $ZrO_2$ | 0.06 λ | 15 | $ZrO_2$ | 0.05 λ | 13 | $SiO_2$ | 0.06 λ | 20 |
| Fourth Layer | $SiO_2$ | 0.04 λ | 14 | $SiO_2$ | 0.04 λ | 14 | $SiO_2$ | 0.03 λ | 10 | $ZrO_2$ | 0.27 λ | 66 |
| Fifth Layer | $ZrO_2$ | 0.32 λ | 80 | $ZrO_2$ | 0.3 λ | 75 | $ZrO_2$ | 0.305 λ | 77 | $SiO_2$ | 0.28 λ | 94 |
| Sixth Layer | $SiO_2$ | 0.26 λ | 89 | $SiO_2$ | 0.27 λ | 90 | $SiO_2$ | 0.28 λ | 94 | | | |
| | Average Reflectivity at 400 to 500 nm | | 3.13 | Average Reflectivity at 400 to 500 nm | | 6.11 | Average Reflectivity at 400 to 500 nm | | 9.31 | Average Reflectivity at 400 to 500 nm | | 0.65 |
| | Reflectivity (Maximum) at 580 to 780 nm | | 4.57 | Reflectivity (Maximum) at 580 to 780 nm | | 5.89 | Reflectivity (Maximum) at 580 to 780 nm | | 6.35 | Reflectivity (Maximum) at 580 to 780 nm | | 3.58 |

The wearing of the optical products obtained in this manner was evaluated.

Wearing Evaluation

Pairs of glasses with the optical components manufactured in accordance with the examples were worn during PC deskwork to perform evaluation with glasses with the optical component manufactured in accordance with the comparative example. Conditions in the evaluation and determination items are as follows.

The number of Monitors: 10
Display: 17-Inch Liquid Crystal Display
Working Time: 1 Hour/Day
Wearing Period: 1 Week
Determination Items:
1. Glare
2. Ease of Viewing Displayed Letters and the like
3. Feeling of Fatigue The most suitable one of Examples 1 to 3 and Comparative Example 1 in each evaluation item was rated O. The results are shown in Table 2.

TABLE 2

<Test 1>
*The most suitable sample for each evaluation item is selected.

| | Evaluation Item | | | | | | | | | | | |
|---|---|---|---|---|---|---|---|---|---|---|---|---|
| | Glare | | | | Ease of Viewing Displayed Letters and the like | | | | Feeling of Fatigue | | | |
| Monitor No. | Example 1 | Example 2 | Example 3 | Comparative Example 1 | Example 1 | Example 2 | Example 3 | Comparative Example 1 | Example 1 | Example 2 | Example 3 | Comparative Example 1 |
| 1 | | O | | | | O | | | | O | | |
| 2 | O | | | | | | | O | O | | | |
| 3 | | | O | | O | | | | | O | | |
| 4 | | | O | | | | O | | O | | | |
| 5 | | O | | | O | | | | O | | | |
| 6 | | O | | | | | O | | O | | | |
| 7 | | | O | | | O | | | O | | | |
| 8 | O | | | | | O | | | | O | | |
| 9 | | O | | | | O | | | | O | | |
| 10 | | O | | | | O | | | | | O | |
| Total | 2 | 4 | 4 | 0 | 2 | 5 | 2 | 1 | 3 | 6 | 1 | 0 |

As a result of the comparative wearing evaluation, it was confirmed that the characteristic in which an average reflectivity was 2% to 10% over a wavelength range of 400 nm to 500 nm was effective in the determination items. As in the following description, Example 2 in which the average reflectivity was about 6% over a wavelength range of 400 nm to 500 nm was evaluated as the most suitable one in each evaluation item.

The number of people who gave an evaluation in which Example 2 was the most suitable one of Examples 1 to 3 and Comparative Example 1 in each evaluation item is as follows:
1. Glare: 4/10
2. Ease of Viewing Display: 5/10
3. Feeling of Fatigue: 6/10

Test 2

On a synthetic resin substrate, a silicon-based hard coating having a refractive index of 1.67 was prepared by thermal curing, and film formation was performed by a vacuum deposition method as follows.

Example 2

Film formation was performed under the same film formation conditions as in Example 2 of Test 1.

Example 4

Convex Surface: A lens was set in a rotating dome provided in a vacuum chamber, the temperature in the vacuum chamber was adjusted to 70 degrees Celsius by heating, air was exhausted until the pressure was adjusted to $1.0 \times 10^{-3}$ Pa, and Ar ion beam cleaning was carried out for 60 seconds under conditions of an acceleration voltage of 500 V and an acceleration current of 100 mA. Then, a first layer $ZrO_2$ (refractive index 2.00) having an optical film thickness of $0.155\lambda$, a second layer $SiO_2$ (refractive index 1.47) having an optical film thickness of $0.045\lambda$, a third layer $ZrO_2$ (refractive index 2.00) having an optical film thickness of $0.5\lambda$, and a fourth layer $SiO_2$ (refractive index 1.47) having an optical film thickness of $0.335\lambda$ were sequentially applied from the plastic base side. $\lambda$ is 500 nm in terms of center wavelength of design.

Concave Surface: After the same pretreatment with the same device and the same processing atmosphere as in the case of the convex surface, a first layer $SiO_2$ (refractive index 1.47) having an optical film thickness of $0.10\lambda$, a second layer $ZrO_2$ (refractive index 2.00) having an optical film thickness of $0.16\lambda$, a third layer $SiO_2$ (refractive index 1.47) having an optical film thickness of $0.06\lambda$, a fourth layer $ZrO_2$ (refractive index 2.00) having an optical film thickness of $0.25\lambda$, and a fifth layer $SiO_2$ (refractive index 1.47) having an optical film thickness of $0.28\lambda$ were sequentially applied from the plastic base side. $\lambda$ is 500 nm in terms of center wavelength of design.

Figure 8:
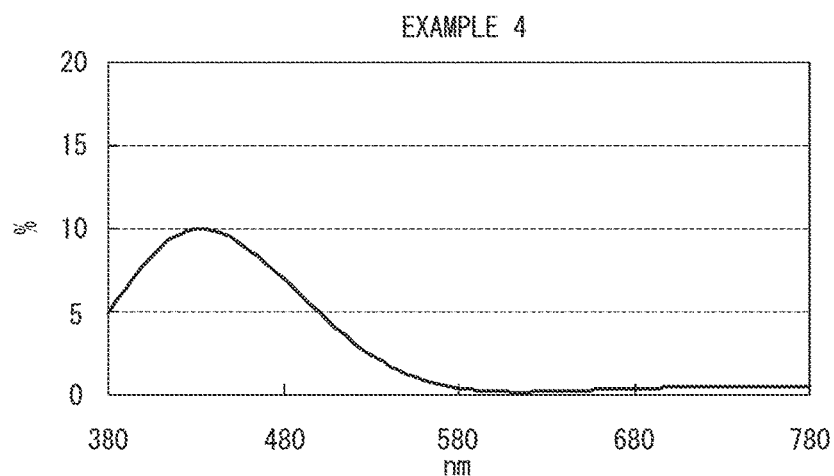
FIG. 8 is a graph showing a spectral characteristic of an antireflection film according to Example 4.

The spectral characteristic in Example 4 is shown in FIG. 8.

Comparative Example 1

Film formation was performed under the same film formation conditions as in Comparative Example 1 of Test 1.

The formed layers in Examples 2 and 4 and Comparative Example 1 are shown in detail in Table 3.

TABLE 3

| | <Test 2> | | | | | | | | |
|---|---|---|---|---|---|---|---|---|---|
| | <Example 2> | | | <Example 4> | | | <Comparative Example 1> | | |
| | Material | Optical Film Thickness | Physical Film Thickness (nm) | Material | Optical Film Thickness | Physical Film Thickness (nm) | Material | Optical Film Thickness | Physical Film Thickness (nm) |
| First Layer | $ZrO_2$ | $0.07\ \lambda$ | 18 | $ZrO_2$ | $0.155\ \lambda$ | 39 | $SiO_2$ | $0.10\ \lambda$ | 33 |
| Second Layer | $SiO_2$ | $0.59\ \lambda$ | 201 | $SiO_2$ | $0.045\ \lambda$ | 15 | $ZrO_2$ | $0.16\ \lambda$ | 39 |
| Third Layer | $ZrO_2$ | $0.06\ \lambda$ | 15 | $ZrO_2$ | $0.485\ \lambda$ | 122 | $SiO_2$ | $0.06\ \lambda$ | 20 |
| Fourth Layer | $SiO_2$ | $0.04\ \lambda$ | 14 | $SiO_2$ | $0.0335\ \lambda$ | 114 | $ZrO_2$ | $0.27\ \lambda$ | 66 |
| Fifth Layer | $ZrO_2$ | $0.3\ \lambda$ | 75 | | | | $SiO_2$ | $0.28\ \lambda$ | 94 |
| Sixth Layer | $SiO_2$ | $0.27\ \lambda$ | 90 | | | | | | |
| | Average Reflectivity at 400 to 500 nm | | 6.11 | Average Reflectivity at 400 to 500 nm | | 8.30 | Average Reflectivity at 400 to 500 nm | | 0.65 |
| | Reflectivity (Maximum) at 580 to 780 nm | | 5.89 | Reflectivity (Maximum) at 580 to 780 nm | | 0.46 | Reflectivity (Maximum) at 580 to 780 nm | | 3.58 |

The wearing of the optical products obtained in this manner was evaluated.

Wearing Evaluation

Pairs of glasses with the optical components manufactured in accordance with the examples were worn during PC deskwork to perform evaluation with glasses with the optical component manufactured in accordance with the comparative example.

Conditions in the evaluation and determination items are as follows.

Figure 9:
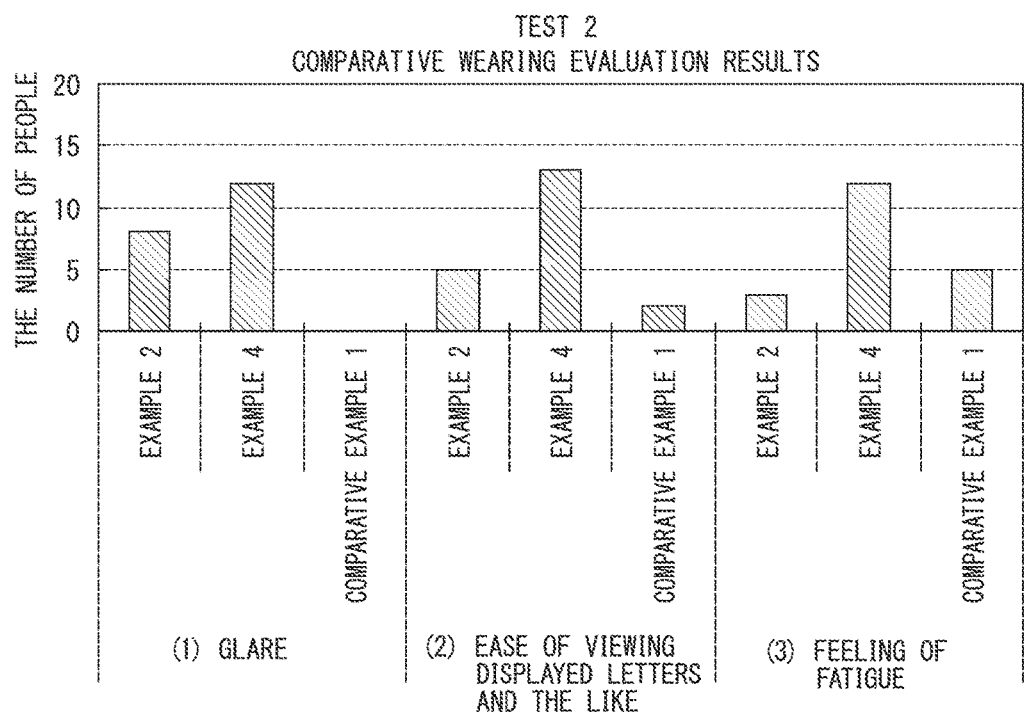
FIG. 9 shows results of a comparative wearing evaluation according to Test 2.

The number of Monitors: 20
Display: 17-Inch Liquid Crystal Display
Working Time: 1 Hour/Day
Wearing Period: 1 Week
Determination Items:
1. Glare
2. Ease of Viewing Displayed Letters and the like
3. Feeling of Fatigue The most suitable one of Examples 2 and 4 and Comparative Example 1 in each evaluation item was rated O. The total number of monitors who gave an evaluation of O is shown in Table 4 and FIG. 9.

TABLE 4

<Test 2>
*The most suitable sample for each evaluation item is selected.

| | Evaluation Item | | | | | | | |
|---|---|---|---|---|---|---|---|---|
| | 1. Glare | | | 2. Ease of Viewing Displayed Letters and the like Monitor No. | | | 3. Feeling of Fatigue | | |
| | Example 2 | Example 4 | Comparative Example 1 | Example 2 | Example 4 | Comparative Example 1 | Example 2 | Example 4 | Comparative Example 1 |
| Total Number of People | 8 | 12 | 0 | 5 | 13 | 2 | 3 | 12 | 5 |

As a result of the comparative wearing evaluation, it was confirmed that adjustment of an average reflectivity to 2% to 10% over a wavelength region of 400 nm to 500 nm and adjustment of a reflectivity to 1.5% or less over a wavelength region of 580 nm to 780 nm were more effective in each determination.

Test 3

On a urethane-based synthetic resin substrate, a silicon-based hard coating having a refractive index of 1.67 and a primer coating having a refractive index of 1.67 were prepared by thermal curing, and film formation was performed by a vacuum deposition method as follows.

Example 5

Convex Surface and Concave Surface: A lens was set in a rotating dome provided in a vacuum chamber, the temperature in the vacuum chamber was adjusted to 70 degrees Celsius by heating, air was exhausted until the pressure was adjusted to $1.0 \times 10^{-3}$ Pa, and ion beam cleaning was carried out for 60 seconds under conditions of an acceleration voltage of 500 V and an acceleration current of 100 mA. Then, a first layer $ZrO_2$ (refractive index 2.00) having an optical film thickness of $0.10\lambda$, a second layer $SiO_2$ (refractive index 1.47) having an optical film thickness of $0.10\lambda$, a third layer $ZrO_2$ (refractive index 2.00) having an optical film thickness of $0.205\lambda$, a fourth layer $SiO_2$ (refractive index 1.47) having an optical film thickness of $0.06\lambda$, a fifth layer $ZrO_2$ (refractive index 2.00) having an optical film thickness of $0.16\lambda$, and a sixth layer $SiO_2$ (refractive index 1.47) having an optical film thickness of $0.335\lambda$ were sequentially applied from the plastic base side. $\lambda$ is 500 nm in terms of center wavelength of design.

Figure 10:
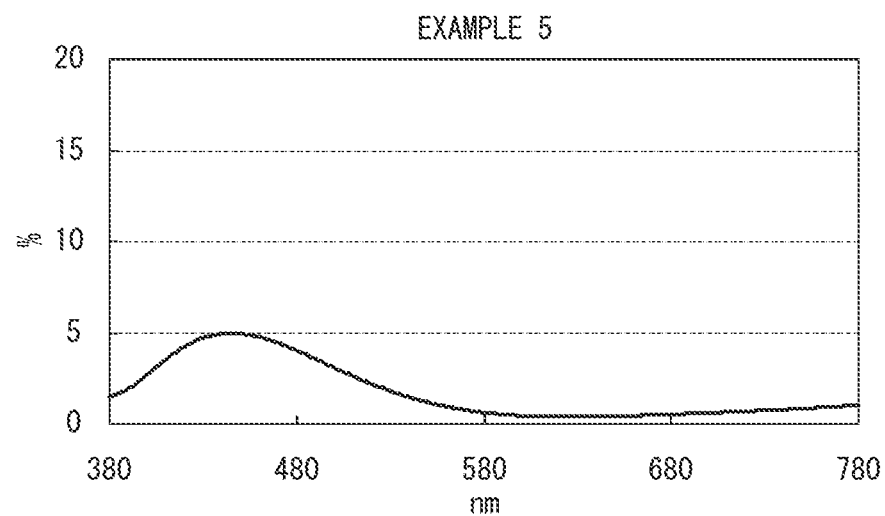
FIG. 10 is a graph showing a spectral characteristic of an antireflection film according to Example 5.

The spectral characteristic in Example 5 is shown in FIG. 10.

Example 6

Convex Surface: A lens was set in a rotating dome provided in a vacuum chamber, the temperature in the vacuum chamber was adjusted to 70 degrees Celsius by heating, air was exhausted until the pressure was adjusted to $1.0 \times 10^{-3}$ Pa, and ion beam cleaning was carried out for 60 seconds under conditions of an acceleration voltage of 500 V and an acceleration current of 100 mA. Then, a first layer $ZrO_2$ (refractive index 2.00) having an optical film thickness of $0.125\lambda$, a second layer $SiO_2$ (refractive index 1.47) having an optical film thickness of $0.095\lambda$, a third layer $ZrO_2$ (refractive index 2.00) having an optical film thickness of $0.21\lambda$, a fourth layer $SiO_2$ (refractive index 1.47) having an optical film thickness of $0.07\lambda$, a fifth layer $ZrO_2$ (refractive index 2.00) having an optical film thickness of $0.14\lambda$, and a sixth layer $SiO_2$ (refractive index 1.47) having an optical film thickness of $0.35\lambda$ were sequentially applied from the plastic base side. $\lambda$ is 500 nm in terms of center wavelength of design.

Concave Surface: After the same pretreatment with the same device and the same processing atmosphere as in the case of the convex surface, a first layer $ZrO_2$ (refractive index 2.00) having an optical film thickness of $0.105\lambda$, a second layer $SiO_2$ (refractive index 1.47) having an optical film thickness of $0.095\lambda$, a third layer $ZrO_2$ (refractive index 2.00) having an optical film thickness of $0.23\lambda$, a fourth layer $SiO_2$ (refractive index 1.47) having an optical film thickness of $0.07\lambda$, a fifth layer $ZrO_2$ (refractive index 2.00) having an optical film thickness of $0.14\lambda$, and a sixth layer $SiO_2$ (refractive index 1.47) having an optical film thickness of $0.33\lambda$ were sequentially applied from the plastic base side. $\lambda$ is 500 nm in terms of center wavelength of design.

Figure 11:
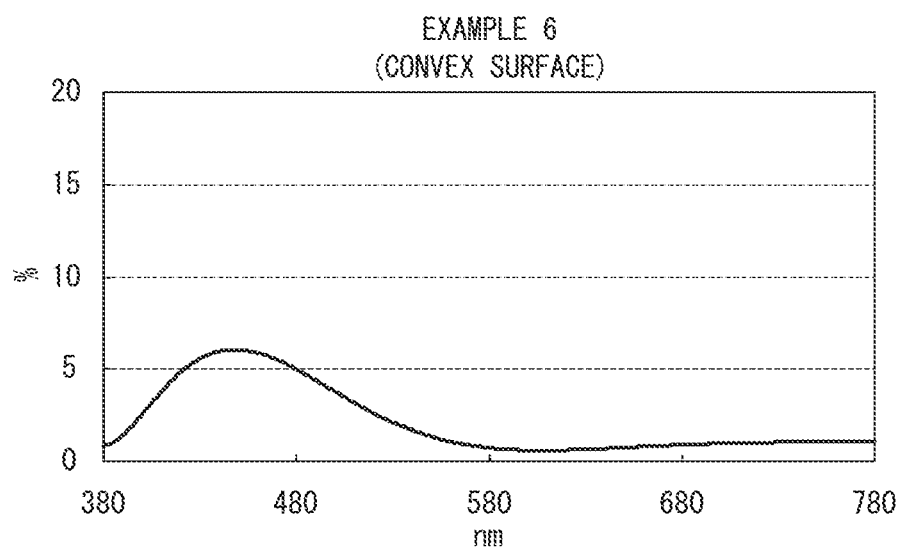
FIG. 11 is a graph showing a spectral characteristic of a convex surface of an antireflection film according to Example 6.
Figure 12:
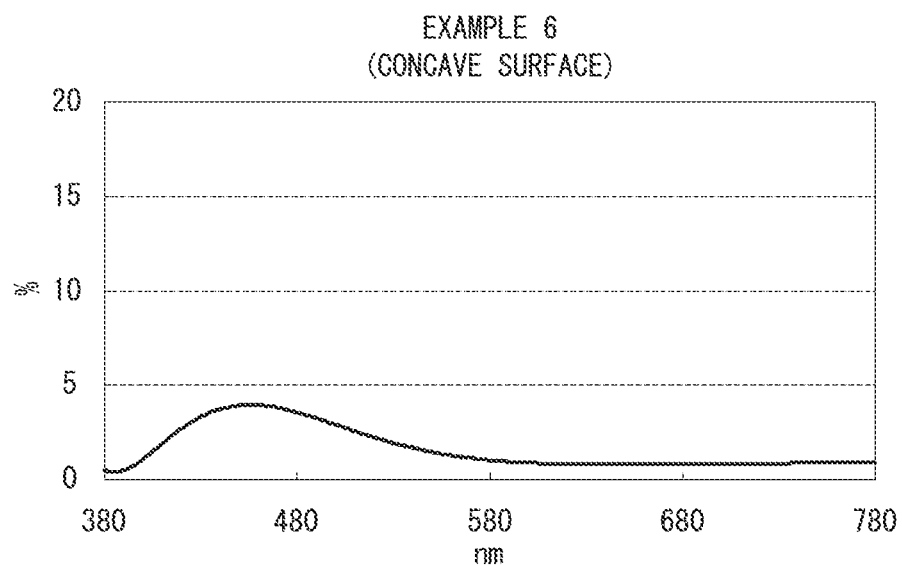
FIG. 12 is a graph showing a spectral characteristic of a concave surface of the antireflection film according to Example 6.

The spectral characteristic of the convex surface in Example 6 is shown in FIG. 11, and the spectral characteristic of the concave surface is shown in FIG. 12.

Example 7

Convex Surface: A lens was set in a rotating dome provided in a vacuum chamber, the temperature in the vacuum chamber was adjusted to 70 degrees Celsius by heating, air was exhausted until the pressure was adjusted to $1.0 \times 10^{-3}$ Pa, and ion beam cleaning was carried out for 60 seconds under conditions of an acceleration voltage of 500 V and an acceleration current of 100 mA. Then, a first layer $ZrO_2$ (refractive index 2.00) having an optical film thickness of $0.135\lambda$, a second layer $SiO_2$ (refractive index 1.47) having an optical film thickness of $0.085\lambda$, a third layer $ZrO_2$ (refractive index 2.00) having an optical film thickness of $0.20\lambda$, a fourth layer $SiO_2$ (refractive index 1.47) having an optical film thickness of $0.055\lambda$, a fifth layer $ZrO_2$ (refractive index 2.00) having an optical film thickness of $0.19\lambda$, and a sixth layer $SiO_2$ (refractive index 1.47) having an optical film thickness of $0.35\lambda$, were sequentially applied from the plastic base side. $\lambda$ is 500 nm in terms of center wavelength of design.

Concave Surface: After the same pretreatment with the same device and the same processing atmosphere as in the case of the convex surface, a first layer $ZrO_2$ (refractive index 2.00) having an optical film thickness of 0.11λ, a second layer SiO₂ (refractive index 1.47) having an optical film thickness of 0.09λ, a third layer ZrO₂ (refractive index 2.00) having an optical film thickness of 0.22λ, a fourth layer SiO₂ (refractive index 1.47) having an optical film thickness of 0.06λ, a fifth layer ZrO₂ (refractive index 2.00) having an optical film thickness of 0.20λ, and a sixth layer SiO₂ (refractive index 1.47) having an optical film thickness of 0.33λ were sequentially applied from the plastic base side. λ is 500 nm in terms of center wavelength of design.

Figure 13:
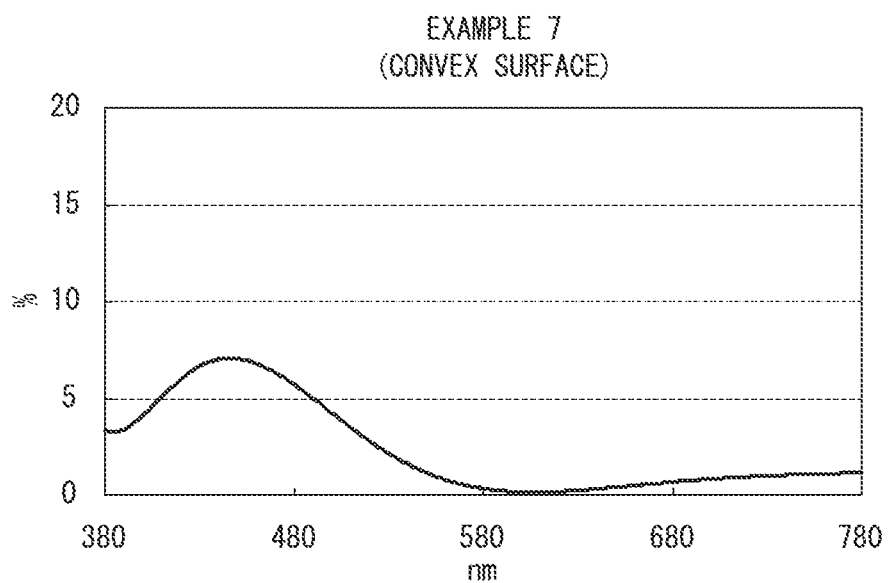
FIG. 13 is a graph showing a spectral characteristic of a convex surface of an antireflection film according to Example 7.
Figure 14:
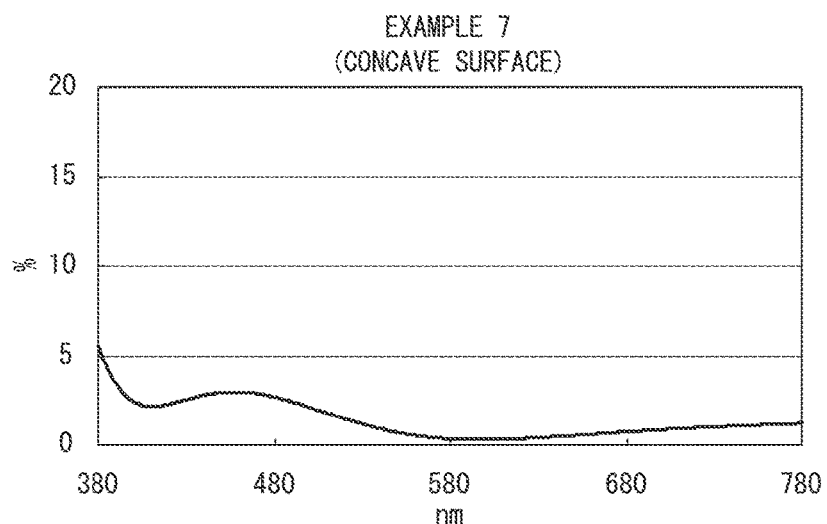
FIG. 14 is a graph showing a spectral characteristic of a concave surface of the antireflection film according to Example 7.

The spectral characteristic of the convex surface in Example 7 is shown in FIG. 13, and the spectral characteristic of the concave surface is shown in FIG. 14.

The formed layers in Examples 5 to 7 are shown in detail in Table 5.

TABLE 5

| | <Example 5 (Convex Surface, Concave Surface)> | | | <Example 6 (Convex Surface)> | | | <Example 6 (Concave Surface)> | | |
|---|---|---|---|---|---|---|---|---|---|
| | Material | Optical Film Thickness | Physical Film Thickness (nm) | Material | Optical Film Thickness | Physical Film Thickness (nm) | Material | Optical Film Thickness | Physical Film Thickness (nm) |
| First Layer | ZrO₂ | 0.10 λ | 25 | ZrO₂ | 0.125 λ | 31 | ZrO₂ | 0.105 λ | 26 |
| Second Layer | SiO₂ | 0.10 λ | 34 | SiO₂ | 0.095 λ | 32 | SiO₂ | 0.095 λ | 32 |
| Third Layer | ZrO₂ | 0.205 λ | 52 | ZrO₂ | 0.21 λ | 53 | ZrO₂ | 0.23 λ | 58 |
| Fourth Layer | SiO₂ | 0.06 λ | 20 | SiO₂ | 0.07 λ | 24 | SiO₂ | 0.07 λ | 24 |
| Fifth Layer | ZrO₂ | 0.16 λ | 40 | ZrO₂ | 0.14 λ | 35 | ZrO₂ | 0.14 λ | 35 |
| Sixth Layer | SiO₂ | 0.335 λ | 114 | SiO₂ | 0.35 λ | 119 | SiO₂ | 0.33 λ | 113 |
| | Average Reflectivity at 400 to 500 nm | | 4.20 | Average Reflectivity at 400 to 500 nm | | 5.00 | Average Reflectivity at 400 to 500 nm | | 3.20 |
| | Reflectivity (Maximum) at 580 to 780 nm | | 1.02 | Reflectivity (Maximum) at 580 to 780 nm | | 1.09 | Reflectivity (Maximum) at 580 to 780 nm | | 1.02 |

| | <Example 7 (Convex Surface)> | | | <Example 7 (Concave Surface)> | | |
|---|---|---|---|---|---|---|
| | Material | Optical Film Thickness | Physical Film Thickness (nm) | Material | Optical Film Thickness | Physical Film Thickness (nm) |
| First Layer | ZrO₂ | 0.135 λ | 34 | ZrO₂ | 0.11 λ | 28 |
| Second Layer | SiO₂ | 0.085 λ | 29 | SiO₂ | 0.09 λ | 31 |
| Third Layer | ZrO₂ | 0.20 λ | 50 | ZrO₂ | 0.22 λ | 55 |
| Fourth Layer | SiO₂ | 0.055 λ | 19 | SiO₂ | 0.06 λ | 20 |
| Fifth Layer | ZrO₂ | 0.19 λ | 48 | ZrO₂ | 0.20 λ | 50 |
| Sixth Layer | SiO₂ | 0.35 λ | 119 | SiO₂ | 0.33 λ | 113 |
| | Average Reflectivity at 400 to 500 nm | | 6.00 | Average Reflectivity at 400 to 500 nm | | 2.60 |
| | Reflectivity (Maximum) at 580 to 780 nm | | 1.16 | Reflectivity (Maximum) at 580 to 780 nm | | 1.2 |

The wearing of the optical products obtained in this manner was evaluated.

Wearing Evaluation

Pairs of glasses with the optical components manufactured in accordance with the examples were worn during PC deskwork and evaluated. Conditions in the evaluation and determination items are as follows.

The number of Monitors: 20

Display: 17-Inch Liquid Crystal Display

Working Time: 1 Hour/Day

Wearing Period: 2 Weeks

Determination Items:

1. Glare

2. Ease of Viewing Displayed Letters and the like

3. Feeling of Fatigue

Figure 15:
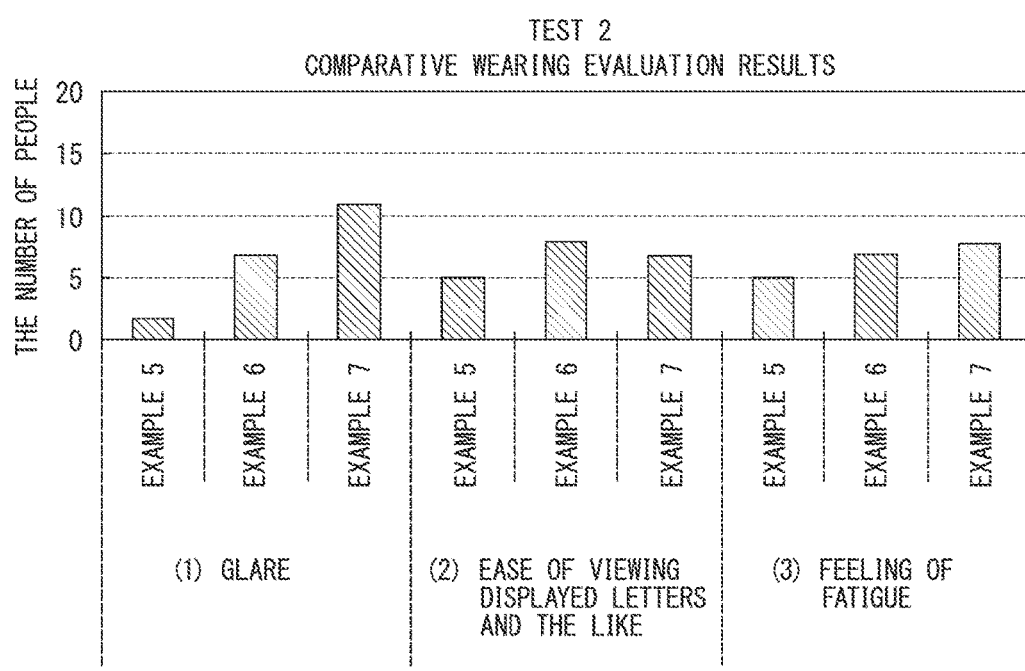
FIG. 15 shows results of a comparative wearing evaluation according to Test 3.

The most suitable one of Examples 5 to 7 in each evaluation item was rated 0. The total number of monitors who gave an evaluation of 0 is shown in Table 6 and FIG. 15.

TABLE 6

| | Evaluation Item | | | | | | | | |
|---|---|---|---|---|---|---|---|---|---|
| | 1. Glare | | | 2. Ease of Viewing Displayed Letters and the like Monitor No. | | | 3. Feeling of Fatigue | | |
| | Example 5 | Example 6 | Example 7 | Example 5 | Example 6 | Example 7 | Example 5 | Example 6 | Example 7 |
| Total Number of People | 2 | 7 | 11 | 5 | 8 | 7 | 5 | 7 | 8 |

As a result of the comparative wearing evaluation, it was confirmed that adjustment of an average reflectivity of the convex surface to 5% to 10% and adjustment of an average reflectivity of the concave surface to 2% to 4% over a wavelength region of 400 nm to 500 nm and adjustment of a reflectivity to 1.5% or less over a wavelength region of 580 nm to 780 nm were particularly effective for a reduction in glare.

From the above results, according to the invention, an optical component which has an antiglare effect and excellent visibility without feeling of fatigue which is caused by wearing and a method of manufacturing the optical component can be provided.

What is claimed is:

1. A spectacle lens comprising:
   a plastic base which has a convex surface and a concave surface; and
   a multilayer film which is disposed on at least the convex surface of the plastic base,
   wherein the multilayer film has an average reflectivity of 4.2% to 10% over a wavelength range of 400 nm to 500 nm of blue light.

2. The spectacle lens according to claim 1,
   wherein the multilayer film has a reflectivity of 1.5% or less over a wavelength range of 580 nm to 780 nm.

3. The spectacle lens according to claim 1,
   wherein an antireflection film having an average reflectivity of 1.5% or less over a wavelength range of 380 nm to 780 nm is disposed on the concave surface of the plastic base.

4. The spectacle lens according to claim 1,
   wherein the average reflectivity of the multilayer film disposed on the convex surface of the plastic base over a wavelength range of 400 nm to 500 nm is greater than the average reflectivity of the multilayer film disposed on the concave surface of the plastic base over a wavelength range of 400 nm to 500 nm.

5. The spectacle lens according to claim 4,
   wherein the average reflectivity of the multilayer film disposed on the convex surface of the plastic base over a wavelength range of 400 nm to 500 nm is 5% to 10%, and the average reflectivity of the multilayer film disposed on the concave surface of the plastic base over a wavelength range of 400 nm to 500 nm is 2% to 4%.

6. The spectacle lens according to claim 1,
   wherein the plastic base is colored and its transmissivity is 5% to 85%.

7. The spectacle lens according to claim 1, further comprising:
   a water-and-oil repellent film including a fluorine-substituted alkyl group-containing organosilicon compound which is provided on the outermost layer of the multilayer film which is most distant from the plastic base.

8. The spectacle lens according to claim 7,
   wherein the fluorine-substituted alkyl group-containing organosilicon compound is at least one or more of the types of fluorine-substituted alkyl group-containing organosilicon compounds selected from among the following general formulas (1) to (6):

[Chem. 1]

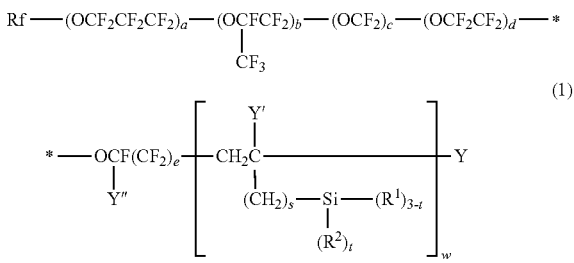

(1)

(in the formula (1), Rf represents a straight or branched perfluoroalkyl group with 1 to 16 carbon atoms, Y represents iodine or hydrogen, Y' represents hydrogen or a lower alkyl group with 1 to 5 carbon atoms, Y" represents fluorine or a trifluoromethyl group, $R^1$ represents a hydrolyzable group, $R^2$ represents hydrogen or an inert monovalent organic group, a, b, c, and d each represents an integer of 0 to 200, e represents 0 or 1, s and t each represents an integer of 0 to 2, and w represents an integer of 1 to 10);

[Chem. 2]

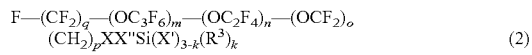

(2)

[Chem. 3]

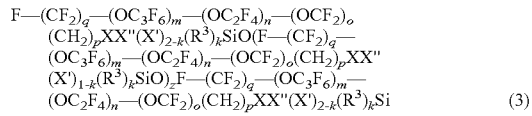

(3)

[Chem. 4]

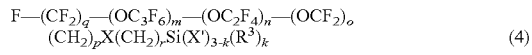

(4)

[Chem. 5]

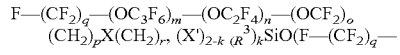

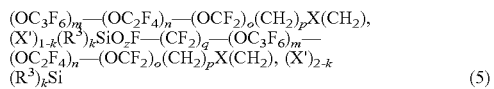

(in the formulas (2) to (5), X represents oxygen or a divalent organic group, X' represents a hydrolyzable group, X" represents a divalent organosilicon group, $R^3$ represents a straight or branched alkylene group with 1 to 22 carbon atoms, q represents an integer of 1 to 3, m, n, and o each represents an integer of 0 to 200, p represents 1 or 2, r represents an integer of 2 to 20, k represents an integer of 0 to 2, and z represents an integer of 0 to 10 when k is 0 or 1); and

[Chem. 6]

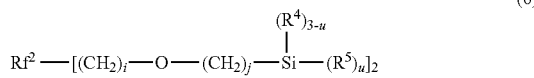

(in the formula (6), $Rf^2$ represents a divalent straight perfluoropolyether group, $R^4$ represents a phenyl group or an alkyl group with 1 to 4 carbon atoms, $R^5$ represents a hydrolyzable group, i represents an integer of 0 to 2, j represents an integer of 1 to 5, and u represents 2 or 3).

9. The spectacle lens according to claim 1, wherein the multilayer film is a multilayer film of four or more layers.

10. The spectacle lens according to claim 1, wherein a functional thin film is provided between the plastic base and the multilayer film.

11. The spectacle lens according to claim 1, wherein a dielectric film or a metallic film having a thickness of 20 nm or less is provided between a high refractive index material and a low refractive index material constituting the multilayer film.

12. The spectacle lens according to claim 1, wherein the high refractive index material includes zirconium dioxide, and the low refractive index material includes silicon dioxide.

13. A method of manufacturing a spectacle lens which includes a plastic base which has a convex surface and a concave surface and a multilayer film which is disposed on at least the convex surface of the plastic base, the method comprising the steps of:

heating the plastic base; and forming the multilayer film on the plastic base after adjusting the temperature of the plastic base to a predetermined temperature by the heating step, wherein the step of forming the multilayer film has a process of forming a high refractive index layer having a multilayer structure by alternately applying a high refractive index material and a low refractive index material in multilayers, and a process of forming, on the high refractive index layer, a low refractive index layer having a lower refractive index than that of the high refractive index layer, and wherein an average reflectivity of the multilayer film over a wavelength range of 400 nm to 500 nm is 4.2% to 10% of blue light.

14. The method of manufacturing the spectacle lens according to claim 13, wherein a step of forming the multilayer film using a vacuum deposition method is included.

15. The method of manufacturing the spectacle lens according to claim 13, wherein the step of forming the multilayer film includes a step of forming at least one of the layers constituting the multilayer film while carrying out ion beam assist.

16. The method of manufacturing the spectacle lens according to claim 15, wherein the ion beam assist is performed using at least one type of gas selected from among an inert gas, oxygen gas, and a mixed gas of inert gas and oxygen gas.

17. The method of manufacturing the spectacle lens according to claim 16, wherein the inert gas is argon.

* * * * *

UNITED STATES PATENT AND TRADEMARK OFFICE
CERTIFICATE OF CORRECTION

PATENT NO. : 10,371,867 B2
APPLICATION NO. : 13/851679
DATED : August 6, 2019
INVENTOR(S) : Tomoda et al.

Page 1 of 1

It is certified that error appears in the above-identified patent and that said Letters Patent is hereby corrected as shown below:

In the Claims

Claim 8, Column 22, Line 67:
"$(CH_2)_p X(CH_2)_r,(X')_{2-k\ (R^3)_k} SiO(F-(CF_2)_q-$" should read
-- $(CH_2)_p X(CH_2)_r (X')_{2-k} (R^3)_k SiO(F-(CF_2)_q-$ --.

Claim 8, Column 23, Line 2, in formula (5):
"$(X')_{1-k}(R^3)_k SiO_z F-(CF_2)_q-(OC_3F_6)_m-$" should read
-- $(X')_{1-k}(R^3)_k SiO)_z F-(CF_2)_q-(OC_3F_6)_m-$ --.

Signed and Sealed this
Twenty-sixth Day of November, 2019

Andrei Iancu
*Director of the United States Patent and Trademark Office*